United States Patent
Lim

(10) Patent No.: US 9,053,769 B2
(45) Date of Patent: Jun. 9, 2015

(54) SEMICONDUCTOR DEVICE CAPABLE OF INCREASING DATA INPUT/OUTPUT RATE

(71) Applicant: SK hynix Inc., Gyeonggi-do (KR)

(72) Inventor: Sang Oh Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/161,352

(22) Filed: Jan. 22, 2014

(65) Prior Publication Data

US 2015/0055421 A1    Feb. 26, 2015

(30) Foreign Application Priority Data

Aug. 23, 2013    (KR) .................. 10-2013-0100442

(51) Int. Cl.
G11C 7/00        (2006.01)
G11C 7/10        (2006.01)

(52) U.S. Cl.
CPC ............ *G11C 7/1087* (2013.01); *G11C 7/1051* (2013.01)

(58) Field of Classification Search
CPC ....... G11C 7/1051; G11C 7/1078; G11C 7/22
USPC .................. 365/189.05, 145, 230.06, 230.08
See application file for complete search history.

(56) References Cited

U.S. PATENT DOCUMENTS

| | | | | |
|---|---|---|---|---|
| 6,967,860 B2* | 11/2005 | Choi et al. | ................. | 365/145 |
| 7,362,620 B2* | 4/2008 | Yano et al. | ............. | 365/189.05 |
| 7,532,521 B2* | 5/2009 | Jo | .......................... | 365/189.05 |
| 7,719,906 B2* | 5/2010 | Tanimura et al. | ........... | 365/200 |

FOREIGN PATENT DOCUMENTS

KR    1019990064902    8/1999

* cited by examiner

*Primary Examiner* — Connie Yoha
(74) *Attorney, Agent, or Firm* — IP & T Group LLP

(57) ABSTRACT

A semiconductor device includes a memory array including memory cells, page buffers suitable for reading data from the memory cells, cache latch circuits suitable for latching read data from the page buffers, and transmitting latched data to data lines in response to a column selection signal, a column selector suitable for outputting the column selection signal to the cache latch circuits through column selection lines in response to a column address, and sense amplifiers suitable for outputting transmitted data of the data lines by sensing voltages of the data lines, in which the cache latch circuits are connected to the column selector and the sense amplifiers through the column selection lines and the data lines, respectively, and have inverse relationship between the column selection lines and the data lines in length.

9 Claims, 10 Drawing Sheets

SEMICONDUCTOR DEVICE CAPABLE OF INCREASING DATA INPUT/OUTPUT RATE

CROSS-REFERENCE TO RELATED APPLICATION

The present application claims priority to Korean patent application number 10-2013-0100442 filed on Aug. 23, 2013, in the Korean Intellectual Property Office, the entire disclosure of which is incorporated by reference herein.

BACKGROUND

1. Technical Field

Various embodiments of the present invention relate to an electronic device, and more particularly, to a semiconductor device.

2. Related Art

A semiconductor memory device among semiconductor devices is generally classified into a volatile memory device and a nonvolatile memory device.

The volatile memory device has a high write and read rate, but loses stored data when a power supply is cut off. The nonvolatile memory device has a relatively low write and read rate, but maintains stored data even though a power supply is cut off. Accordingly, the nonvolatile memory device is used to store data which is to be maintained regardless of the power supply. The nonvolatile memory device includes a Read Only Memory (ROM), a Mask ROM (MROM), a Programmable ROM (PROM), an Erasable Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is generally divided between a NOR type and a NAND type.

The flash memory has an advantage of the RAM programming and erasing data freely, and an advantage of the ROM maintaining stored data even though a power supply is cut off. The flash memory is widely used as a storage medium of a portable electronic device, such as a digital camera, a Personal Digital Assistant (PDA), and an MP3 player.

Recently, a demand for a semiconductor device having a fast data input/output rate has been increased.

BRIEF SUMMARY

Exemplary embodiments of the present invention are provided to illustrate a semiconductor device capable of increasing a data input/output rate.

An embodiment of the present invention provides a semiconductor device including a memory array including memory cells, page buffers suitable for reading data from the memory cells, cache latch circuits suitable for latching read data from the page buffers, and transmitting latched data to data lines in response to a column selection signal, a column selector suitable for outputting the column selection signal to the cache latch circuits through column selection lines in response to a column address, and sense amplifiers suitable for outputting transmitted data of the data lines by sensing voltages of the data lines, wherein the cache latch circuits are connected to the column selector and the sense amplifiers through the column selection lines and the data lines, respectively, and have inverse relationship between the column selection lines and the data lines in length.

The cache latch circuits may be disposed between the column selector and the sense amplifiers.

The cache latch circuits may correspond one-to-one to the page buffers, respectively.

According to the semiconductor device according to the exemplary embodiment of the present invention, the column selector and the sense amplifiers are disposed so that the cache latch circuits have inverse relationship between the column selection lines and the data lines in length, thereby improving a data input/output rate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
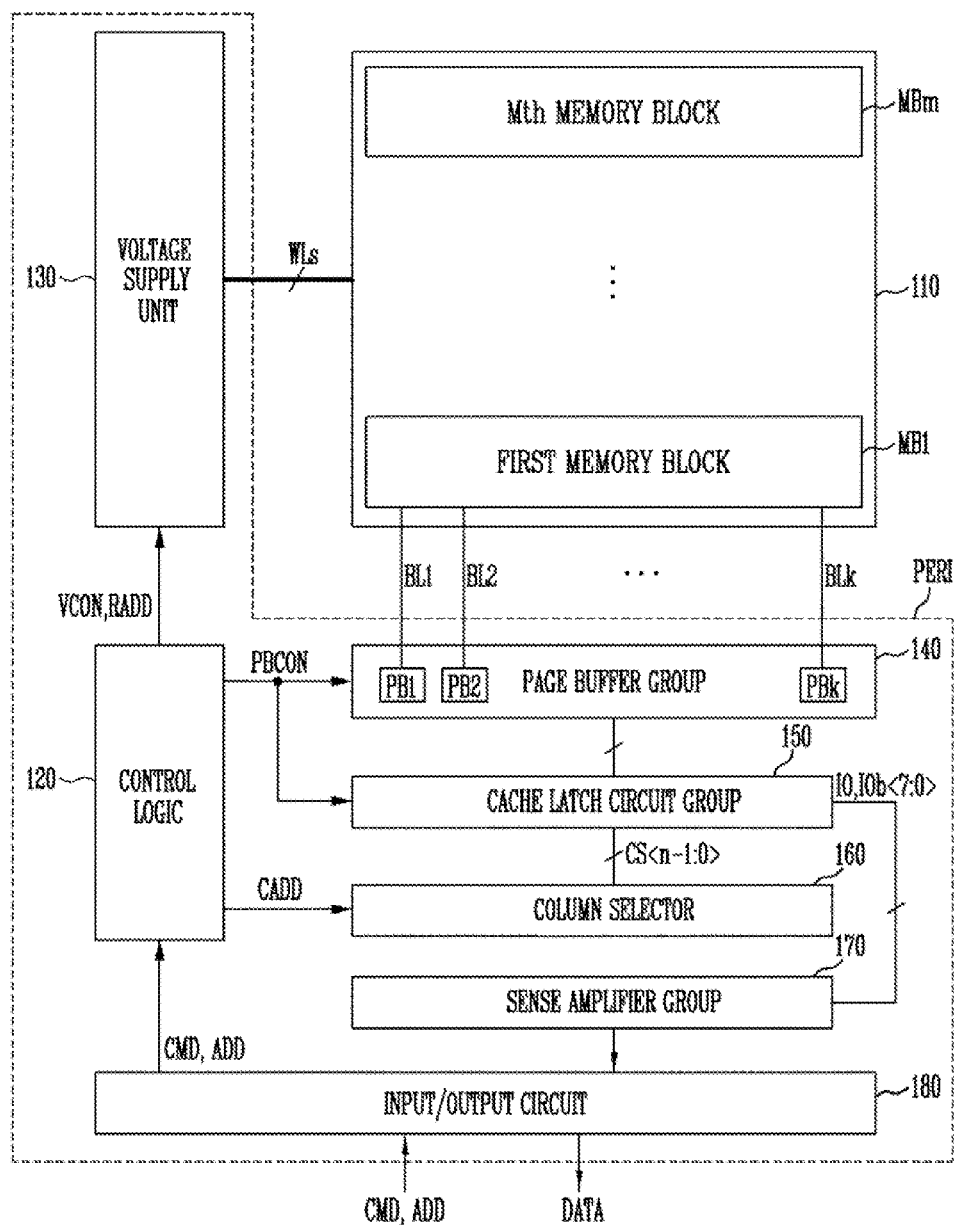
FIG. 1 is a block diagram illustrating a semiconductor device according to an exemplary embodiment of the present invention.

Hereinafter, an exemplary embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
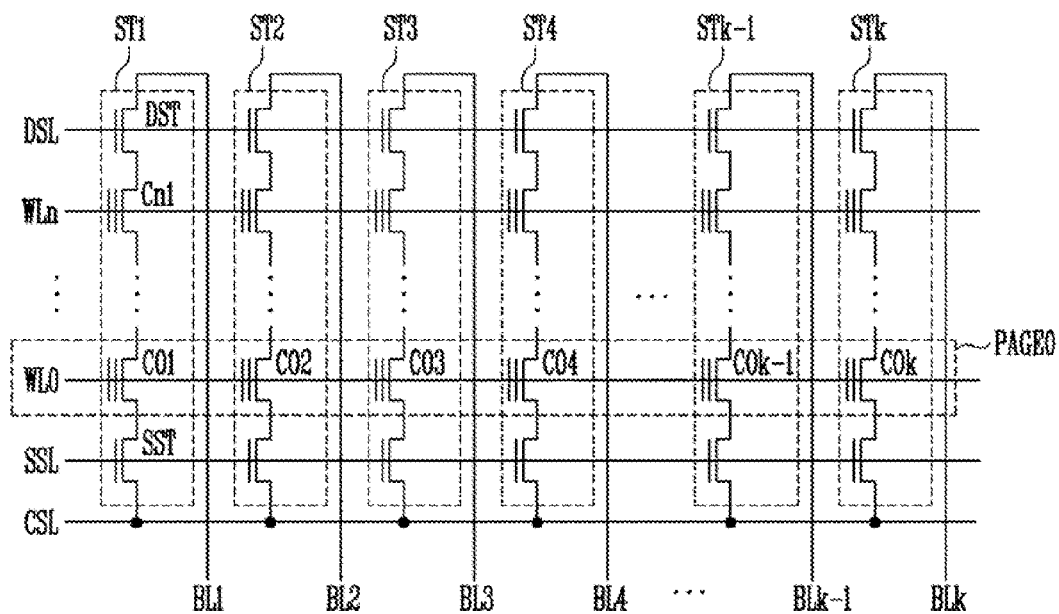
FIG. 2 is a circuit diagram illustrating a memory block illustrated in FIG. 1.

FIG. 1 is a block diagram illustrating a semiconductor device according to an exemplary embodiment of the present invention. FIG. 2 is a circuit diagram illustrating a memory block illustrated in FIG. 1.

Referring to FIG. 1, the semiconductor device according to the exemplary embodiment of the present invention includes a memory array 110 including first to $m^{th}$ memory blocks MB1 to MBm, and a peripheral circuit PERI configured to perform a read operation on memory cells included in a selected page of the memory blocks MB1 to MBm and output read data. The peripheral circuit PERI includes a control logic 120, a voltage supply unit 130, a page buffer group 140, a cache latch circuit group 150, a column selector 160, a sense amplifier group 170, and an input/output circuit 180.

Referring to FIG. 2, each memory block includes a plurality of strings ST1 to STk connected between bit lines BL1 to BLk and a common source line CSL. That is, the strings ST1 to STk are connected to the corresponding bit lines BL1 to BLk, respectively, and the common source line CSL in common. Each string, i.e., the first string ST1, includes a source select transistor SST in which a source is connected to the common source line CSL, a plurality of memory cells C01 to Cn1, and a drain select transistor DST in which a drain is connected to the bit line BL1. The memory cells C01 to Cn1 are serially connected between the select transistors SST and DST. A gate of the source select transistor SST is connected to the source select line SSL, gates of the memory cells C01 to Cn1 are connected to word lines WL0 to WLn, respectively, and a gate of the drain select transistor DST is connected to a drain select line DSL.

The memory cells included in the memory block may be divided in the unit of a physical page or a logical page. For example, the memory cells C01 to C0k connected to one word line (for example, WL0) configure one physical page PAGE0. The page is a basic unit of the read operation.

The control logic 120 outputs a voltage control signal VCON for generating operating voltages in order to perform a read operation in response to a command signal CMD input through the input/output circuit from the outside, and it outputs a PB control signal PBCON for controlling page buffers PB1 to PBk included in the page buffer group 140. An operation of controlling the page buffer group 140 by the control logic 120 will be described below. Further, the control logic 120 outputs a row address signal RADD and a column address signal CADD in response to an address signal ADD input from the outside through the input/output circuit 180.

The voltage supply unit 130 supplies operating voltages for the read operation of the memory cells to local lines including the drain select line DLS, the word lines WL0 to WLn, and the source select line SSL of the selected memory block in response to the voltage control signal VON of the control logic 120. The voltage supply unit 130 includes a voltage generating circuit and a row decoder.

The voltage generating circuit outputs the operating voltages for the read operation of the memory cells to global lines in response to the voltage control signal VCON. For example, for the read operation, the voltage generating circuit outputs a read voltage Vread to be applied to the memory cells of the selected page, and a pass voltage Vpass to be applied to non-selected memory cells to the global lines.

The row decoder connects the global lines and the local lines DSL, WL0 to WLn, and SSL in response to the row address signals RADD of the control logic 120 so that the operating voltages output from the voltage generating circuit to the global lines are transmitted to the local lines DSL, WL0 to WLn, and SSL of the selected memory block in the memory array 110. Accordingly, the read voltage Vread is applied to the local word line (for example, WL0) connected with a selected cell (for example, C01) from the voltage generating circuit through the global word line. Further, the pass voltage Vpass is supplied to the local word lines (for example, WL1 to WLn) connected to non-selected cells C11 to Cn1 from the voltage generating circuit through the global word lines. Accordingly, the data stored in the selected cell C01 is read by the read voltage Vread.

The page buffer group 140 includes the plurality of page buffers PB1 to PBk connected with the memory array 110 through the bit lines BL1 to BLk. The page buffers PB1 to PBk of the page buffer group 140 sense voltages of the bit lines BL1 to BLk in order to read the data from the memory cells (for example, C01 to C0k) in response to the PB control signal PBCON of the control logic 120. For example, in the read operation, the page buffer group 140 senses a change in voltages of the bit lines BL1 to BLk, and latches the data of the memory cells corresponding to the sensing result. The page buffer includes a plurality of elements, and it occupies relatively large area. In FIG. 1, it is illustrated that the page buffers within the page buffer group are arranged in one row, but the page buffers may be arranged in a plurality of rows from a viewpoint of a layout. That is, the predetermined number of page buffers is disposed in one row, and the plurality of rows of page buffers may exist. A detailed configuration of the page buffer will be described later.

The cache latch circuit group 150 includes a plurality of cache latch circuits latching data read by the page buffers PB1 to PBk. The cache latch circuits outputs the read data to the data lines IO, IOb<7:0> in response to a column selection signal CS<n−1:0> input through the column selection line from the column selector 160. The cache latch circuits correspond to the page buffers. The cache latch circuit is separated from the page buffer and is disposed in a separate cache latch circuit group, thereby decreasing a length of the column selection line and increasing a data output rate. Likewise to the page buffers PB1 to PBk, the cache latch circuit includes a plurality of elements. In a viewpoint of the layout, the cache latch circuits may also be disposed in a plurality of row. That is, the predetermined number of cache latch circuits is disposed in one row, and the plurality of rows of cache latch circuits may exist. The cache latch circuit is to be connected with the page buffer, so that the number of rows of the page buffers and the number of rows of the cache latch circuits may be the same as each other. A detailed configuration of the cache latch circuit will be described below.

The column selector 160 outputs a column selection signal CS<n−1:0> for selecting the cache latch circuits included in the cache latch circuit group 150 in response to the column address signal CADD output from the control logic 120. That is, the column selector 160 outputs the column selection signal CS<n−1:0> in response to the column address signal CADD so that data of the memory cells latched in the cache latch circuits by the read operation is output to the sense amplifier group 170.

The sense amplifier group 170 includes a plurality of sense amplifiers sensing voltages of the data lines IO, IOb<7:0> and outputting the sensed voltages to the input/output circuit 170. A detailed configuration of the sense amplifier will be described later.

The input/output circuit 180 outputs the data transmitted through the sense amplifiers included in the sense amplifier group 170 from the cache latch circuits included in the cache latch circuit group 150 to the outside.

Figure 3:
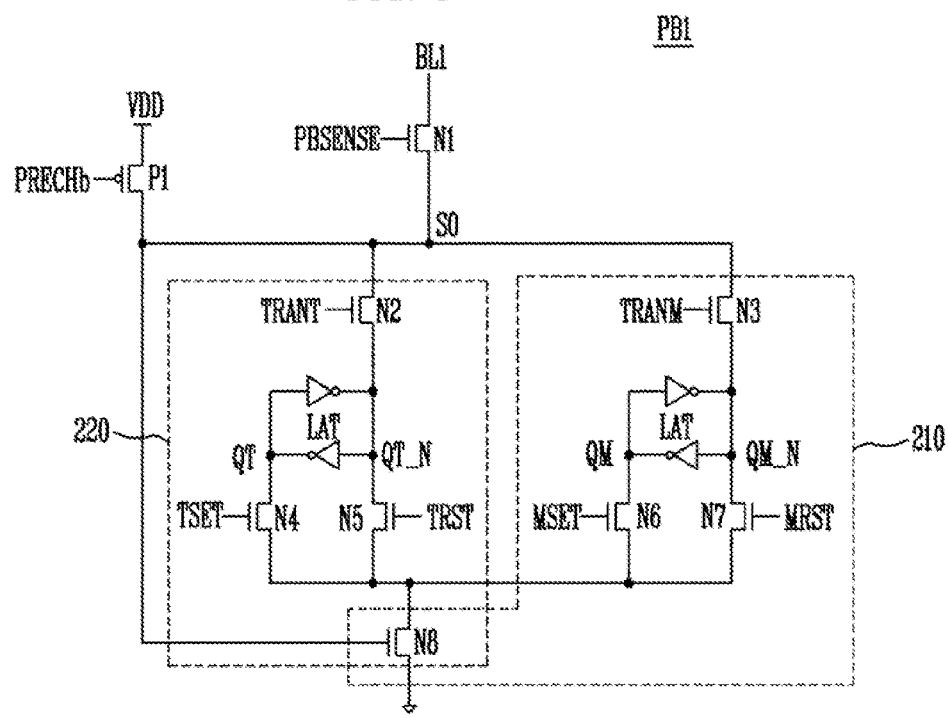
FIG. 3 is a circuit diagram illustrating a page buffer illustrated in FIG. 1.

FIG. 3 is a circuit diagram illustrating a page buffer (for example, the first page buffer PB1) illustrated in FIG. 1.

Referring to FIG. 3, the page buffer is operated under the control of the control logic 120 (see FIG. 1), and signals PRECHb, TRANT, TRANM, TRST, TSET, MRST, MSET, and PBSENSE to be described below may be output as a page buffer control signal PBCON from the control logic.

The page buffer includes a bit line connection unit N1, a precharge unit P1, and a plurality of latch units.

The bit line connection unit N1 performs an operation of connecting the bit line BL1 with one latch unit among the latch units in response to the connection signal PBSENSE. The latch units are connected to the bit line connection unit N1 in parallel, and a connection node between the bit line connection unit N1 and the latch units is a sensing node SO.

The precharge unit P1 performs an operation of precharging the sensing node SO in response to the precharge signal PRECHb.

The number of latch units may be changed depending on a circuit design, and in FIG. 3, a case where two latches units are provided will be described as an example.

The first and second latch units 210 and 220 may latch data by sensing a bit line voltage during the read operation. The first and second latch units 210 and 220 include a plurality of switching elements and latches.

The first latch unit 210 includes a latch LAT for latching data, a switching element N3 configured to connect a first node QM_N of the latch LAT with the sensing node SO in response to the transmission signal TRANM, switching elements N6 and N7 connected with the second node QM and the first node QM_N of the latch LAT, respectively, and operated in response to the set signal MSET and the reset signal MRST, respectively, and a switching elements N8 connected between the switching elements N6 and N7 and a ground voltage terminal and operated in response to a potential of the sensing node SO.

The second latch unit 220 includes a latch LAT for latching data, a switching element N2 configured to connect a first node QT_N of the latch LAT with the sensing node SO in response to the transmission signal TRANT, switching elements N4 and N5 connected with the second node QT and the first node QT_N of the latch LAT, respectively, and operated in response to the set signal TSET and the reset signal TRST, respectively, and a switching elements N8 connected between the switching elements N4 and N5 and the ground voltage terminal and operated in response to a potential of the sensing node SO.

Figure 4:
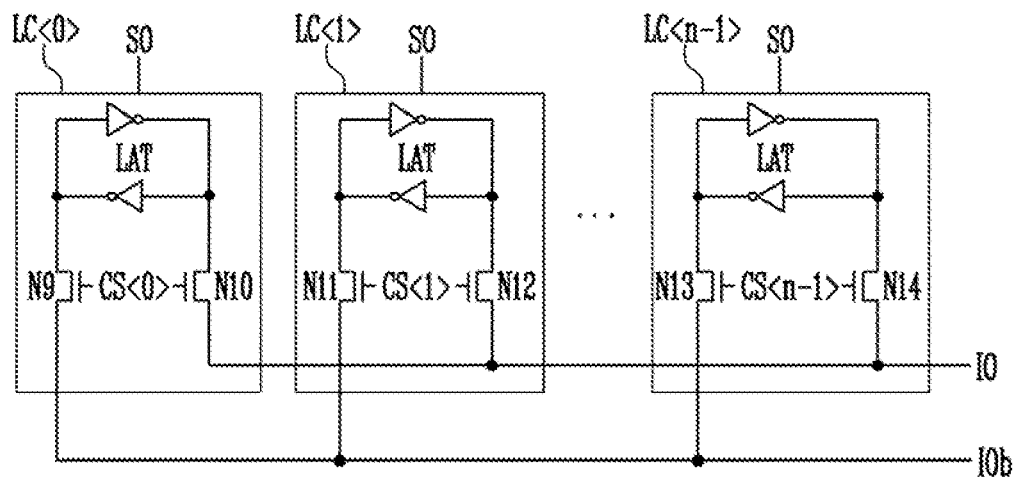
FIG. 4 is a circuit diagram illustrating a cache latch circuit group illustrated in FIG. 1.

FIG. 4 is a circuit diagram for describing the cache latch circuit group illustrated in FIG. 1.

The cache latch circuit group includes a plurality of cache latch circuits. The page buffer and the cache latch circuit correspond to each other, so that the number of cache latch circuits included in the cache latch circuit group is k. However, the cache latch circuits may be disposed in a plurality of rows in a viewpoint of the layout as described above. In FIG. 4, a case in which n cache latch circuits are disposed in one row will be described as an example.

Referring to FIG. 4, the cache latch circuits LC<0> to LC<n−1> outputs non-inverted data of the data transmitted from the page buffers to a non-inverted data line IO and outputs inverted data of the data transmitted from the page buffers to an inverted data line IOb, in response to the column selection signal CS<0> to CS<n−1>.

Each cache latch circuit is connected with the page buffer corresponding through the sensing node SO.

The cache latch circuit LC<0> includes a latch LAT latching the data transmitted from the page buffers, and data output units N9 and N10 outputting inverted data of the latched data to the inverted data line IOb and outputting non-inverted data of the latched data to the non-inverted data line IO in response to the column selection signal CS<0>.

The cache latch circuit LC<1> includes a latch LAT latching the data transmitted from the page buffers, and data output units N11 and N12 outputting inverted data of the latched data to the inverted data line IOb and outputting non-inverted data of the latched data to the non-inverted data line IO in response to the column selection signal CS<1>.

The cache latch circuit LC<n−1> includes a latch LAT latching the data transmitted from the page buffers, and data output units N13 and N14 outputting inverted data of the latched data to the inverted data line IOb and outputting non-inverted data of the latched data to the non-Inverted data line IO in response to the column selection signal CS<n−1>.

Figure 5:
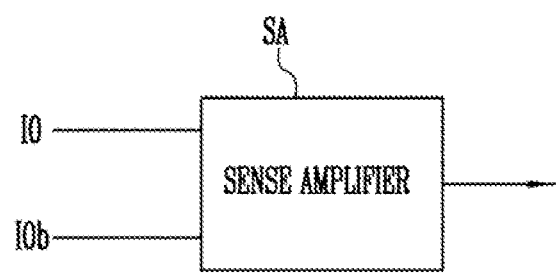
FIG. 5 is a block diagram illustrating a sense amplifier group illustrated in FIG. 1.

FIG. 5 is a block diagram for describing a sense amplifier group illustrated in FIG. 1.

The sense amplifier group includes a plurality of sense amplifiers SA.

Referring to FIG. 5, the sense amplifier SA amplifies a voltage difference between the inverted data line IOb and the non-inverted data line IO and outputs the data. The sense amplifier SA may include a differential amplifier.

Since the sense amplifier SA amplifies a voltage difference between the inverted data line IOb and the non-inverted data line IO and outputs the data, as a voltage development rate of the inverted data line IOb and the non-inverted data line IO is increased, a data output rate is increased. In order to increase the data output rate, loading of the data line IO and IOb may be reduced.

Figure 6:
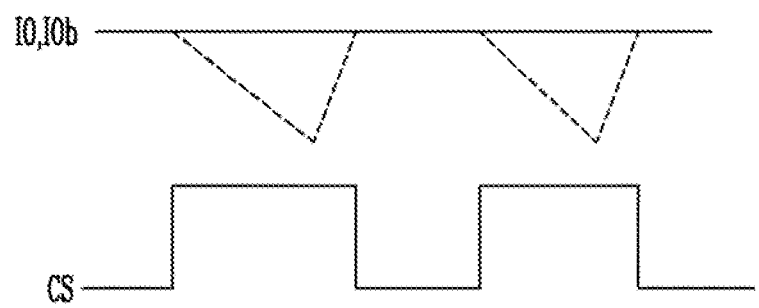
FIG. 6 is a waveform for describing a relationship between a column selection signal and voltage levels of data lines illustrated in FIG. 4.

FIG. 6 is a waveform for describing a relationship between the column selection signal and voltage levels of the data lines illustrated in FIG. 4.

Referring to FIG. 6, when the column selection signal CS is activated, one of the data lines IO and IOb is maintained in a high level (a solid line), and the other is decreased to a low level and then increased (a dotted line), so that a voltage difference is generated between the data lines IO and IOb by the operation of the cache latch circuit.

In order to increase the data output rate, the voltage difference between the data lines IO and IOb may become larger. As an input rate of the column selection signal is increased, that is, the column selection signal transitions in a shorter time, the voltage difference between the data lines IO and IOb may become larger. As loading of the column selection line to which the column selection signal is input is decreased, an input rate of the column selection signal may be increased. Accordingly, in order to increase the data output rate, the loading of the column selection line to which the column selection signal is input may become smaller.

Figure 7:
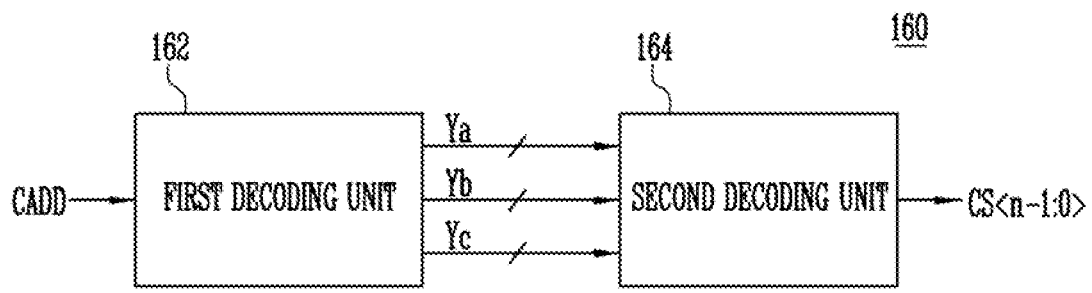
FIG. 7 is a block diagram illustrating a detailed configuration of a column selector illustrated in FIG. 1.

FIG. 7 is a block diagram for describing a detailed configuration of the column selector illustrated in FIG. 1.

Referring to FIG. 7, the column selector 160 includes a first decoding unit 162 and a second decoding unit 164.

The first decoding unit 162 generates first decoding signal Ya, Yb, and Yc in response to the column address CADD input from the control logic 120.

The second decoding unit 164 generates the column selection signal CS<n−1:0> in response to the first decoding signals Ya, Yb, and Yc.

Figure 8:
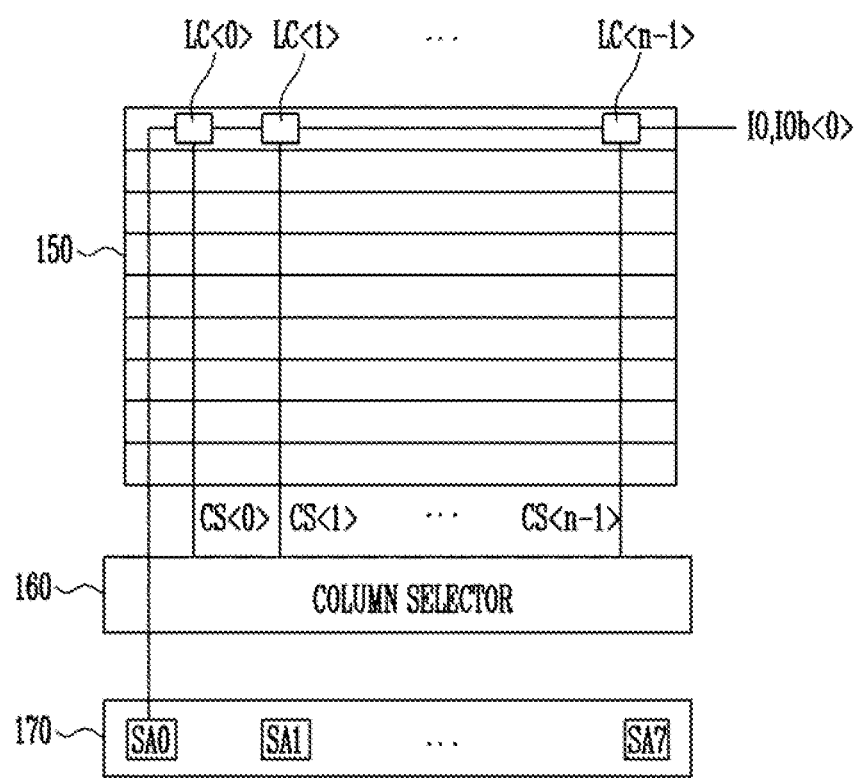
FIGS. 8 and 9 are block diagrams illustrating lengths of column selection lines and data lines in the semiconductor device illustrated in FIG. 1.
Figure 9:
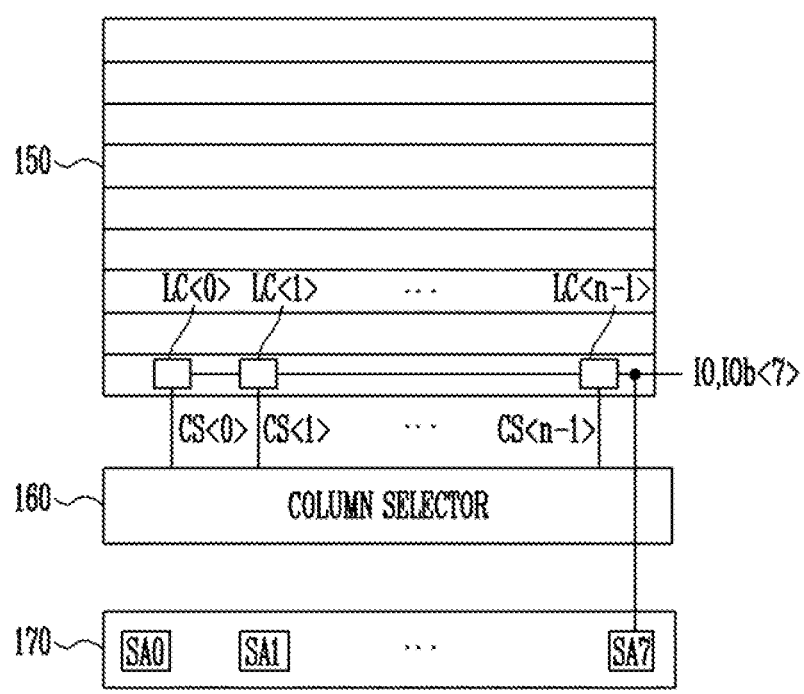

FIGS. 8 and 9 are block diagrams for describing lengths of column selection lines and data lines in the semiconductor device illustrated in FIG. 1.

In FIGS. 8 and 9, the disposition of the cache latch circuit group 150, the column selector 160, and the sense amplifier group 170 is illustrated. A case in which the cache latch circuits included in the cache latch circuit group 150 are disposed in 8 rows, and n cache latch circuits are disposed in one row will be described as an example.

Referring to FIG. 8, the first cache latch circuits LC<0> to LC<n−1> sharing the first data lines IO, IOb<0> are illustrated. Among the data lines IO, IOb<7:0>, the first data lines IO, IOb<0>, which are the distance from the first cache latch circuits LC<0> to LC<n−1> to the first sense amplifier SA0 of the sense amplifier group 170, are the longest. Accordingly, loading of the first data lines IO, IOb<0> is the largest. Further, the first cache latch circuits LC<0> to LC<n−1> receive the column selection signals CS<0> to CS<n−1> from the column selector 160 through the first column selection lines. Among the column selection lines, the first column selection lines are the longest. Accordingly, loading of the first column selection line is the largest, so that an inclination of the column selection signal is the smallest. Accordingly, an amount of the current flowing through the data output unit of the first cache latch circuits is small, so that a development characteristic of the first data lines IO, IOb<0> is the worst.

Referring to FIG. 9, the eighth cache latch circuits LC<0> to LC<n−1> sharing the eighth data lines IO, IOb<7> are illustrated. Among the data lines IO, IOb<7:0>, the eighth data lines IO, IOb<7>, which are the distance from the eighth cache latch circuits LC<0> to LC<n−1> to the eighth sense amplifier SA7 of the sense amplifier group 170, are the shortest. Accordingly, loading of the eighth data lines IO, IOb<7> is the smallest. Further, the eighth cache latch circuits LC<0> to LC<n−1> receive the column selection signals CS<0> to CS<n−1> from the column selector 160 through the eighth column selection lines. Among the column selection lines, the eighth column selection lines are the shortest. Accordingly, loading of the eighth column selection line is the smallest, so that an inclination of the column selection signal is the largest. Accordingly, an amount of the current flowing through the data output unit of the eighth cache latch circuits is large, so that a development characteristic of the eighth data lines IO, IOb<7> is the most excellent.

However, the output of the data is performed in the unit of one byte (8 bits) through the first to eighth data lines. The data output performance may be determined by the data line, which has the worst characteristic, so that sensing and data output performance are determined by the first data lines IO, IOb<0>. Accordingly, general data output performance may deteriorate.

Figure 10:
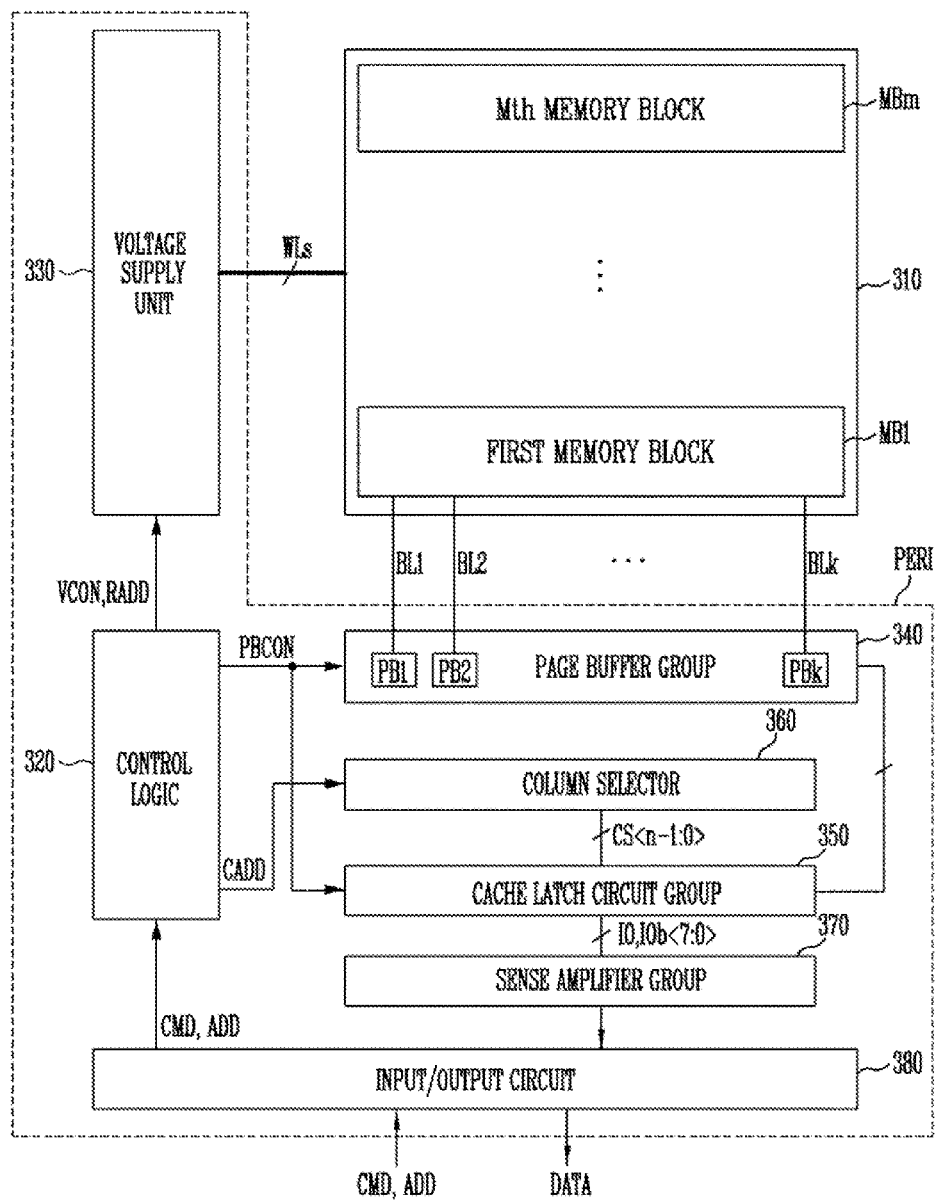
FIG. 10 is a block diagram for describing a semiconductor device according to an exemplary embodiment of the present invention.

FIG. 10 is a block diagram for describing a semiconductor device according to another exemplary embodiment of the present invention.

Referring to FIG. 10, the semiconductor device according to the exemplary embodiment of the present invention includes a memory array 310 including first to m$^{th}$ memory blocks MB1 to MBm, and a peripheral circuit PERI configured to perform a read operation on memory cells included in a selected page of the memory blocks MB1 to MBm and output read data. The peripheral circuit PERI includes a control logic 320, a voltage supply unit 330, a page buffer group 340, a cache latch circuit group 350, a column selector 360, a sense amplifier group 370, and an input/output circuit 380.

The memory array 310, the control logic 320, the voltage supply unit 330, the page buffer group 340, and the input/output circuit 380 are the same as those of the configuration described with reference to FIG. 1, so that detailed descriptions thereof will be omitted.

However, in the semiconductor device illustrated in FIG. 10, the cache latch circuit group 350 is disposed between the column selector 360 and the sense amplifier group 370.

Accordingly, in the cache latch circuits included in the cache latch circuit group 350, a length of the column selection line, which is the distance from the cache latch circuit to the column selector, is inversely proportional to a length of the data line, which is the distance from the cache latch circuit to the sense amplifier. That is, as the length of the column selection line is short, the length of the data line is long, and as the length of the column selection line is long, the length of the data line is short.

Figure 11:
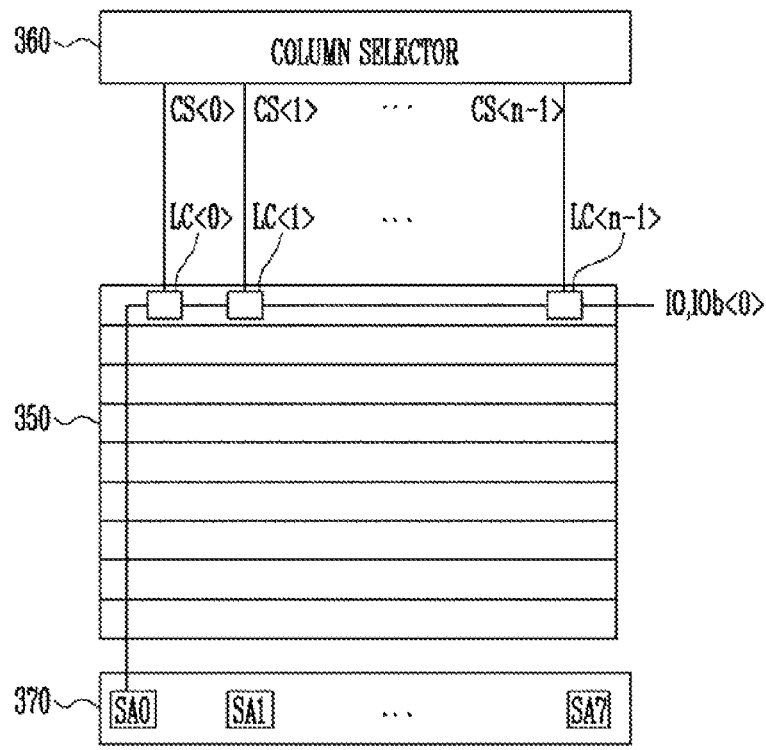
FIGS. 11 and 12 are block diagrams illustrating lengths of column selection lines and data lines in the semiconductor device illustrated in FIG. 10.
Figure 12:
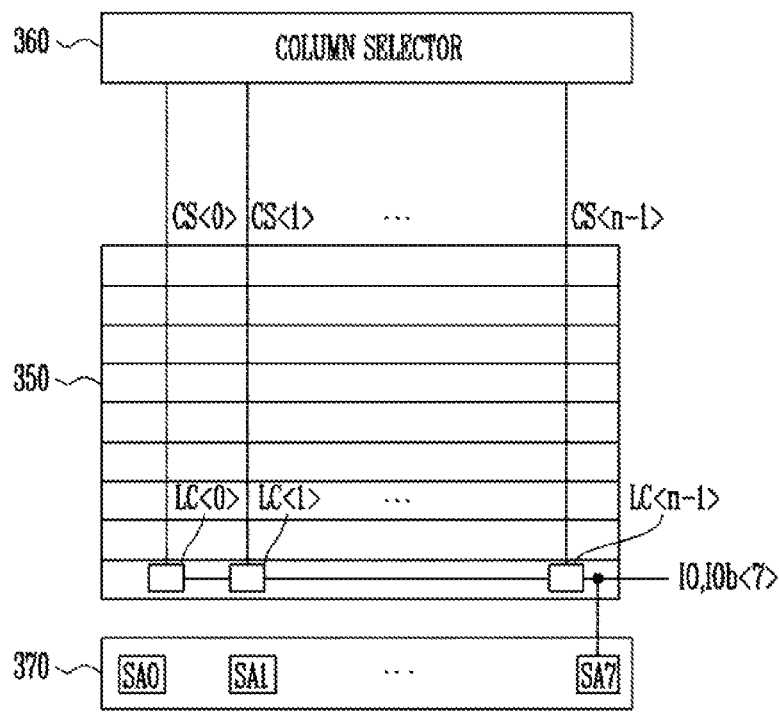

FIGS. 11 and 12 are block diagrams for describing lengths of column selection lines and data lines in the semiconductor device illustrated in FIG. 10.

Referring to FIG. 11, the first cache latch circuits LC<0>~LC<n−1> sharing the first data lines IO, IOb<0> are illustrated. Among the data lines IO, IOb<7:0>, the first data lines IO, IOb<0>, which are the distance from the first cache latch circuits LC<0> to LC<n−1> to the first sense amplifier SA0 of the sense amplifier group 370, are the longest. Accordingly, loading of the first data lines IO, IOb<0> is the largest. However, among the column selection lines, the first column selection lines of the first cache latch circuits LC<0>~LC<n−1> are the shortest. Accordingly, loading of the first column selection line is the smallest, so that an inclination of the column selection signal is the largest. Accordingly, an amount of a current flowing through the data output unit of the first cache latch circuit is large. An effect by the loading of the first data lines offset an effect by the loading of the first column selection line, so that the development characteristic of the data lines is maintained at the average level.

Referring to FIG. 12, the eighth cache latch circuits LC<0>~LC<n−1> sharing the eighth data lines IO, IOb<7> are illustrated. Among the data lines IO, IOb<7:0>, the eighth data lines IO, IOb<7>, which are the distance from the eighth cache latch circuits LC<0> to LC<n−1> to the eighth sense amplifier SA7 of the sense amplifier group 370, are the shortest. Accordingly, loading of the eighth data lines IO, IOb<7> is the smallest. However, among the column selection lines, the eighth column selection lines of the eighth cache latch circuits LC<0>~LC<n−1> are the longest. Accordingly, loading of the eighth column selection line is the largest, so that an inclination of the column selection signal is the smallest. Accordingly, an amount of a current flowing through the data output unit of the eighth cache latch circuit is small. An effect by the loading of the eighth data lines offset an effect by the loading of the eighth column selection line, so that the development characteristic of the data lines is maintained at the average level.

Accordingly, according to the semiconductor device illustrated in FIG. 10, a case in which the development characteristic of the data lines is the worst is not generated, so that a data output rate may be increased.

Figure 13:
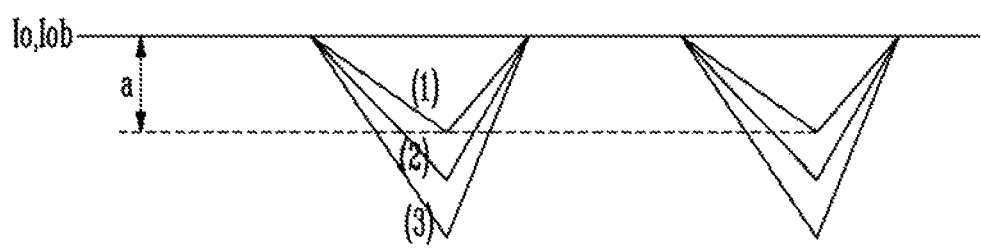
FIG. 13 is a waveform diagram for describing a voltage difference between data lines in the semiconductor device illustrated in FIG. 1.
Figure 14:
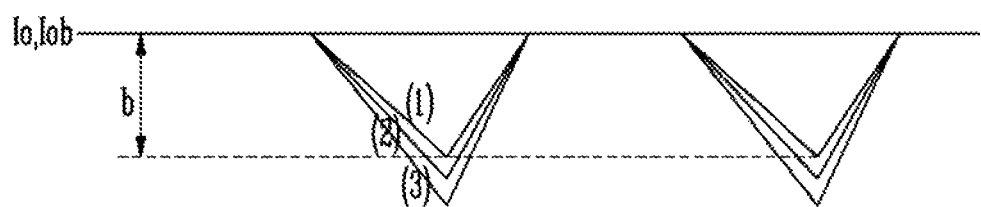
FIG. 14 is a waveform diagram for describing a voltage difference between data lines in the semiconductor device illustrated in FIG. 10.

FIG. 13 is a waveform diagram for describing a voltage difference between data lines in the semiconductor device illustrated in FIG. 1. FIG. 14 is a waveform diagram for describing a voltage difference between data lines in the semiconductor device illustrated in FIG. 10.

In FIGS. 13 and 14, (1) represents a voltage waveform diagram of first data lines IO, IOb<0>, in which a voltage difference between the inverted data line IOb and the non-inverted data line IO among the data lines is the smallest, (2) represents a waveform diagram of an average voltage of the data lines, and (3) represents a voltage waveform of the eighth data lines IO, IOb<7> in which a voltage difference between the inverted data line IOb and the non-inverted data line IO among the data lines is the largest.

Referring to FIG. 13, a minimum value of the voltage difference between the inverted data line IOb and the non-inverted data line IO in the semiconductor device of FIG. 1 is "a". In the semiconductor device of FIG. 1, a deviation of development degrees of the data lines is large.

Referring to FIG. 14, a minimum value of the voltage difference between the inverted data line IOb and the non-inverted data line IO in the semiconductor device of FIG. 10 is "b". In the semiconductor device of FIG. 10, a deviation of development degrees of the data lines is small compared to that of the semiconductor device of FIG. 1. Accordingly, the data output rate of the semiconductor device of FIG. 10 may faster than that of the semiconductor device of FIG. 1.

Figure 15:
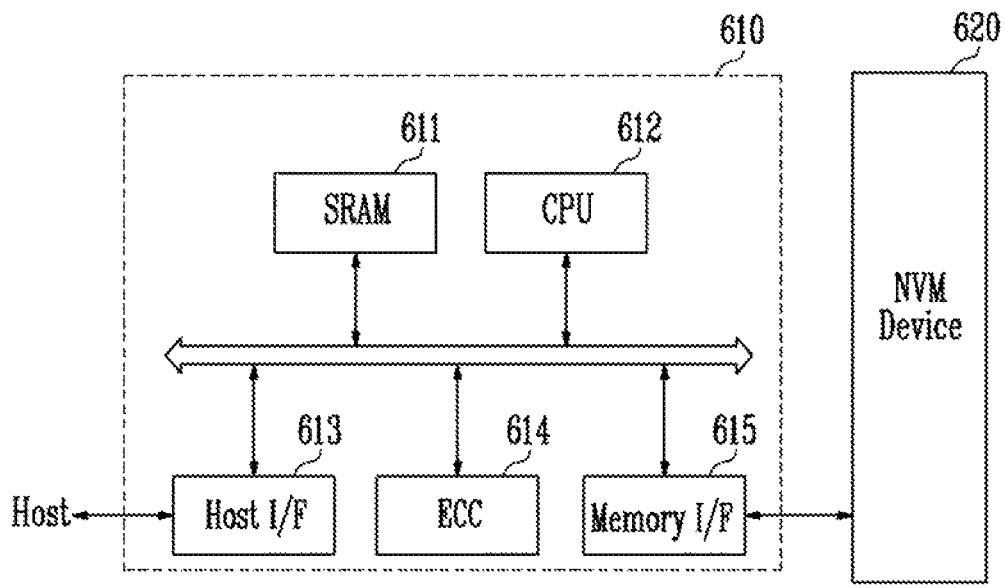
FIG. 15 is a block diagram illustrating a memory system according to an exemplary embodiment of the present invention.

FIG. 15 is a block diagram schematically illustrating a memory system according to an exemplary embodiment of the present invention.

Referring to FIG. 15, a memory system 600 according to the exemplary embodiment of the present invention includes a nonvolatile memory device 620 and a memory controller 610.

The nonvolatile memory device 620 may be formed of the aforementioned semiconductor device for compatibility with the memory controller 610, and may be operated by the aforementioned method. The memory controller 610 may be configured to control the nonvolatile memory device 620. The data may be provided to a memory card or a semiconductor disk device (Solid State Disk: SSD) by a combination of the nonvolatile memory device 620 and the memory controller 610. The SRAM 611 is used as a working memory of a processing unit 612. The host interface 613 includes a data exchange protocol of a host connected with the memory system 600. An error correction block 614 detects and corrects an error included in the data read from the nonvolatile memory device 620. A memory interface 615 interfaces with the nonvolatile memory device 620 of the present invention. The processing unit 612 performs a general control operation for the data exchange of the memory controller 610.

Although it is not illustrated in the drawing, it is apparent to those skilled in the art that the memory system 600 according to the exemplary embodiment of the present invention may further include a ROM storing code data for interfacing with the host. The nonvolatile memory device 620 may also be provided in a form of a multi-chip package including a plurality of flash memory chips. The memory system 600 of the present invention may be provided as a storage medium having a low risk of error generation and high reliability. Especially, the flash memory device of the present invention may be included in a memory system, such as a semiconductor disk device (Solid State Disk: SSD) being actively studied. In this case, the memory controller 610 may be configured to communicate with an external device (for example, the host) through one of various interface protocols, such as USB, MMC, PCI-E, SATA, PATA, SCSI, ESDI, and IDE.

Figure 16:
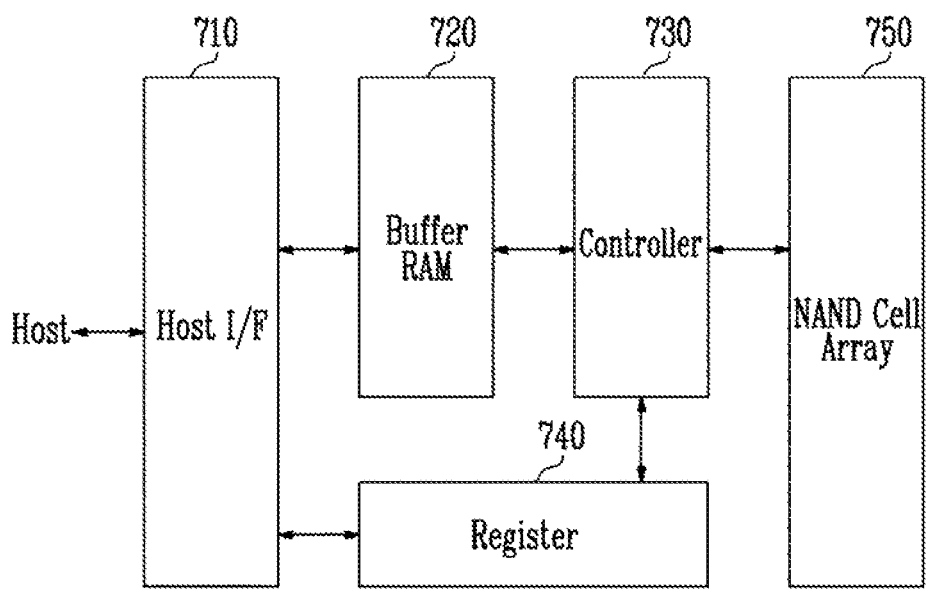
FIG. 16 is a block diagram illustrating a fusion memory device or a fusion memory system performing program operations according to the various embodiments of the present invention.

FIG. 16 is a block diagram schematically illustrating a fusion memory device or a fusion memory system performing program operations according to aforementioned various embodiments. For example, the technical features of the present invention may be applied an OneNAND flash memory device 700 as a fusion memory device.

The OneNAND flash memory device 700 includes a host interface 710 for exchanging various information with a device using different protocols, a buffer RAM 720 including a code for driving the memory device or temporarily storing data, a controller 730 configured to control a read and program, and all of the states in response to a control signal and a command provided from the outside, a register 740 storing a command, an address, and data, such as configuration, defining a system operating environment within the memory device, and a NAND flash cell array 750 formed of the operating circuit including a nonvolatile memory cell and a page buffer. The OneNAND flash memory device programs the data in response to a write request from the host by the aforementioned method.

Figure 17:
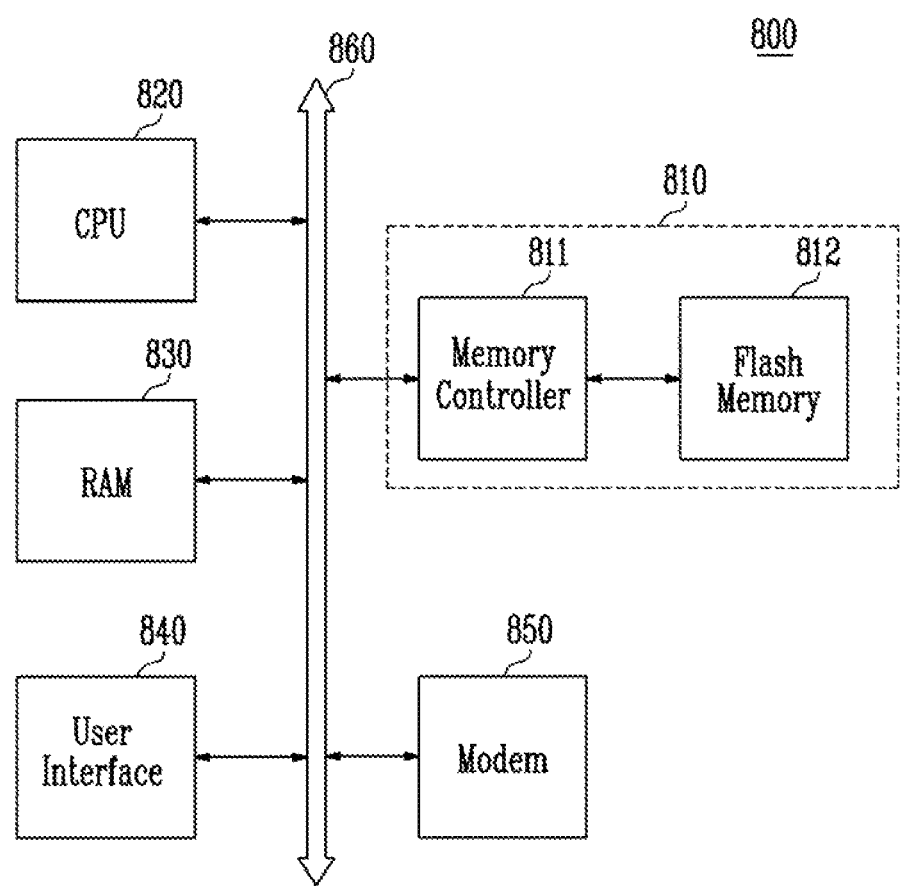
FIG. 17 is a block diagram schematically illustrating a computing system including a flash memory device according to an exemplary embodiment of the present invention.

FIG. 17 schematically illustrates a computing system including a flash memory device 812 according to the embodiment of the present invention.

The computing system 800 according to the embodiment of the present invention includes a microprocessor 820 electrically connected to a system bus 860, a RAM 830, a user interface 840, a modem 850, such as a baseband chipset, and a memory system 810. In a case where the computing system 800 according to the embodiment of the present invention is a mobile device, a battery (not shown) for supplying an operating voltage to the computing system 800 may be further provided. Although it is not illustrated in the drawing, it is apparent to those skilled in the art that the computing system 800 according to the embodiment of the present invention may further include an application chipset, a Camera Image Processor (CIS), a mobile DRAM, and the like. The memory system 800 may further include, for example, a Solid State Drive/Disk (SSD) using a nonvolatile memory for storing data. Otherwise, the memory system 810 may be provided as a fusion flash memory (for example, an OneNAND flash memory).

The above-mentioned exemplary embodiments of the present invention are not embodied only by an apparatus and method. Alternatively, the above-mentioned exemplary embodiments may be embodied by a program performing functions, which correspond to the configuration of the exemplary embodiments of the present invention, or a recording medium on which the program is recorded. These embodiments can be easily devised from the description of the above-mentioned exemplary embodiments by those skilled in the art to which the present invention pertains.

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor device, comprising:
   a memory array including memory cells;
   page buffers suitable for reading data from the memory cells;

cache latch circuits suitable for latching read data from the page buffers, and transmitting latched data to data lines in response to a column selection signal; and a column selector suitable for outputting the column selection signal to the cache latch circuits through column selection lines in response to a column address; and sense amplifiers suitable for outputting transmitted data of the data lines by sensing voltages of the data lines, wherein the cache latch circuits are connected to the column selector and the sense amplifiers through the column selection lines and the data lines, respectively, and have inverse relationship between the column selection lines and the data lines in length.

2. The semiconductor device of claim 1, wherein, among the cache latch circuits, a first cache latch circuit connected to a data line longer than a second cache latch circuit is connected to a column selection line shorter than the second cache latch circuit.

3. The semiconductor device of claim 1, wherein the cache latch circuits are disposed between the column selector and the sense amplifiers.

4. The semiconductor device of claim 1, wherein each cache latch circuit outputs inverted data of the read data to an inverted data line of the data lines and outputs non-inverted data of the read data to a non-inverted data line of the data lines, in response to the column selection signal.

5. The semiconductor device of claim 4, wherein the each cache latch circuit includes;

a latch suitable for latching the read data; and a data output unit suitable for outputting inverted data of the latched data to the inverted data line and output non-inverted data of the latched data to the non-inverted data line in response to the column selection signal.

6. The semiconductor device of claim 4, wherein each sense amplifiers amplifies a voltage difference between the inverted data line and the non-inverted data line to output the transmitted data.

7. The semiconductor device of claim 1, wherein the column selector further includes:

a first decoding unit suitable for generating first decoding signals in response to the column address; and a second decoding unit suitable for generating the column selection signal in response to the first decoding signals.

8. The semiconductor device of claim 1, wherein the cache latch circuits correspond one-to-one to the respective page buffers.

9. The semiconductor device of claim 8, wherein each cache latch circuit is disposed with respect to each page buffer to decrease lengths of the column selection line and the data lines.

* * * * *